(12) United States Patent
Farrar

(10) Patent No.: US 7,560,305 B2
(45) Date of Patent: Jul. 14, 2009

(54) APPARATUS AND METHOD FOR HIGH DENSITY MULTI-CHIP STRUCTURES

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,092

(22) Filed: Aug. 31, 2005

(65) Prior Publication Data

US 2006/0063302 A1 Mar. 23, 2006

Related U.S. Application Data

(62) Division of application No. 10/654,038, filed on Sep. 3, 2003.

(51) Int. Cl.
*H01L 21/44* (2006.01)
*H01L 21/48* (2006.01)
*H01L 21/50* (2006.01)

(52) U.S. Cl. .................. 438/109; 438/118; 438/459

(58) Field of Classification Search ............. 438/109, 438/107, 110, 118, 622, 112, 124, 127, 459, 438/977, 612, 666, 637, 667, 672, 675; 257/685, 257/686, 723, 777, 730
See application file for complete search history.

(56) References Cited

U.S. PATENT DOCUMENTS

| | | |
|---|---|---|
| 4,525,921 A | 7/1985 | Carson et al. |
| 4,617,160 A | 10/1986 | Belanger et al. |
| 4,706,166 A | 11/1987 | Go |
| 4,868,712 A | 9/1989 | Woodman |
| 5,158,986 A | 10/1992 | Cha et al. |
| 5,202,754 A | 4/1993 | Bertin et al. |
| 5,270,261 A | 12/1993 | Bertin et al. |
| 5,334,356 A | 8/1994 | Baldwin et al. |
| 5,347,428 A * | 9/1994 | Carson et al. ............ 361/760 |
| 5,478,781 A | 12/1995 | Bertin et al. |
| 5,506,753 A | 4/1996 | Bertin et al. |
| 5,581,498 A | 12/1996 | Ludwig et al. |
| 5,620,742 A | 4/1997 | Lauritzen |
| 5,658,451 A | 8/1997 | Leiner |
| 5,807,791 A | 9/1998 | Bertin et al. |
| 5,903,045 A | 5/1999 | Bertin et al. |
| 6,077,792 A | 6/2000 | Farrar |
| 6,090,636 A | 7/2000 | Geusic et al. |

(Continued)

OTHER PUBLICATIONS

Chiniwalla, P., "Structure-Property Relations for Polynorbornenes", *Proceedings from the Eighth Meeting of the Dupont Symposium on Polymides In Microelectronics*, (1998),pp. 615-642.

(Continued)

*Primary Examiner*—A. Sefer
*Assistant Examiner*—Dilinh P Nguyen
(74) *Attorney, Agent, or Firm*—Schwegman, Lundberg & Woessner, P.A.

(57) ABSTRACT

Devices and methods are described including a multi-chip assembly. Embodiments of multi-chip assemblies are provided that uses both lateral connection structures and through chip connection structures. One advantage of this design includes an increased number of possible connections. Another advantage of this design includes shorter distances for interconnection pathways, which improves device performance and speed.

20 Claims, 6 Drawing Sheets

U.S. PATENT DOCUMENTS

| | | |
|---|---|---|
| 6,122,187 A | 9/2000 | Ahn et al. |
| 6,136,689 A | 10/2000 | Farrar |
| 6,143,616 A | 11/2000 | Geusic et al. |
| 6,150,188 A * | 11/2000 | Geusic et al. .................. 438/31 |
| 6,198,168 B1 | 3/2001 | Geusic et al. |
| 6,313,531 B1 | 11/2001 | Geusic et al. |
| 6,383,924 B1 | 5/2002 | Farrar et al. |
| 6,521,512 B2 | 2/2003 | Vasquez |
| 6,526,191 B1 | 2/2003 | Geusic et al. |
| 6,535,320 B1 | 3/2003 | Burns |
| 6,633,081 B2 | 10/2003 | Sahara et al. |
| 6,781,241 B2 | 8/2004 | Nishimura et al. |
| 2002/0117742 A1 | 8/2002 | Miyamoto et al. |
| 2003/0230792 A1 | 12/2003 | Wu et al. |

OTHER PUBLICATIONS

Jayaraj, K., "Low Dielectric Constant Microcellular Foams", *Proceedings from the Seventh Meeting of the DuPont Symposium on Polymides in Microelectrics,* (Sep. 1996),474-501.

Miller, R. D., "Low Dielectric Constant Polyimides and Polyimide Nanofoams", *Seventh Meeting of the DuPont Symposium on Polymides in Microelectronics,* (Sep. 1996),pp. 443-473.

Ting, C. H., "Low K Material/Process Development", *1996 VLSI Multilevel Interconnection State-of-the-Art Seminar,* (Jun. 1996),pp. 171-212.

* cited by examiner

APPARATUS AND METHOD FOR HIGH DENSITY MULTI-CHIP STRUCTURES

CROSS-REFERENCE TO RELATED APPLICATIONS

The present application is a divisional of U.S. Ser. No. 10/654,038, filed Sep. 3, 2003, which is herein incorporated by reference in its entirety.

TECHNICAL FIELD

This invention relates to semiconductor chips and chip assemblies. Specifically, this invention relates to multi-chip structures and methods of forming multi-chip structures.

BACKGROUND

An ever present goal in the semiconductor industry has been to decrease the size of devices, and to increase the performance of devices. However, both of these goals present large technical hurdles as the two goals are often in conflict with each other.

As the minimum feature size achievable in semiconductor manufacturing decreases, the capacitive coupling between adjacent metal lines becomes a significant impediment to achieving higher performance. Further, as the minimum feature size decreases the number of devices potentially achievable in a given area increases, as a second power function. The number of wiring connections is increasing at least as rapidly. In order to accommodate the increased wiring, the chip designer would like to shrink the space between adjacent lines to the minimum achievable dimension. This has the unfortunate effect of increasing the capacitive load.

One way to accommodate the increased wiring and reduce capacitive load is to substitute lower dielectric constant materials for the insulating material. A common insulating material to date is $SiO_2$, which has a dielectric constant of around 4, is now used in most very large scale integrated circuit (VLSI) chips. Another way to accommodate the increased wiring and reduce capacitive load is to shorten the distance between devices by more dense packaging.

What is needed is a device design and method that improves the performance and reduces the size of a multi-chip assembly. Specifically, devices and methods are needed that utilize improved insulating materials. Further, devices and methods are needed that utilize improved dense packaging configurations.

SUMMARY

The above mentioned problems such as the need for increased wiring connections, the need for decreased capacitive coupling, and the need for more dense packaging are addressed by the present invention and will be understood by reading and studying the following specification.

A multi-chip assembly is shown. In one embodiment, the multi-chip assembly includes a number of chips. At least one memory chip and at least one logic chip are included in the number of chips. The multi-chip assembly also includes a number of chip edge connection structures used to couple selected chips in the number of chips. The multi-chip assembly also includes a number of through chip connection structures used to couple selected chips in the number of chips.

An information handling system is also shown. In one embodiment, the information handling system includes a display and an input controller. The information handling system also includes a multi-chip assembly. In one embodiment, the multi-chip assembly includes a number of chips. At least one memory chip and at least one logic chip are included in the number of chips. The multi-chip assembly also includes a number of chip edge connection structures used to couple selected chips in the assembly of chips. The multi-chip assembly also includes a number of through chip connection structures used to couple selected chips in the assembly of chips. The information handling system also includes a bus connecting the display, the input controller, and the multi-chip assembly.

A method of forming a multi-chip assembly is also shown. The method includes forming a number of chip edge connection structures in selected chips of a assembly of chips. The method also includes forming a number of through chip connection structures in selected chips of the number of chips. The method further includes interconnecting portions of the assembly of chips using the chip edge connection structures and the through chip connection structures, wherein at least one logic chip and at least one memory chip are included in the assembly of chips.

Other embodiments include, but are not limited to operations such as thinning of the chips used to form the multi-chip assembly, and including foamed polymers as insulating layers between chips in the multi-chip assembly.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
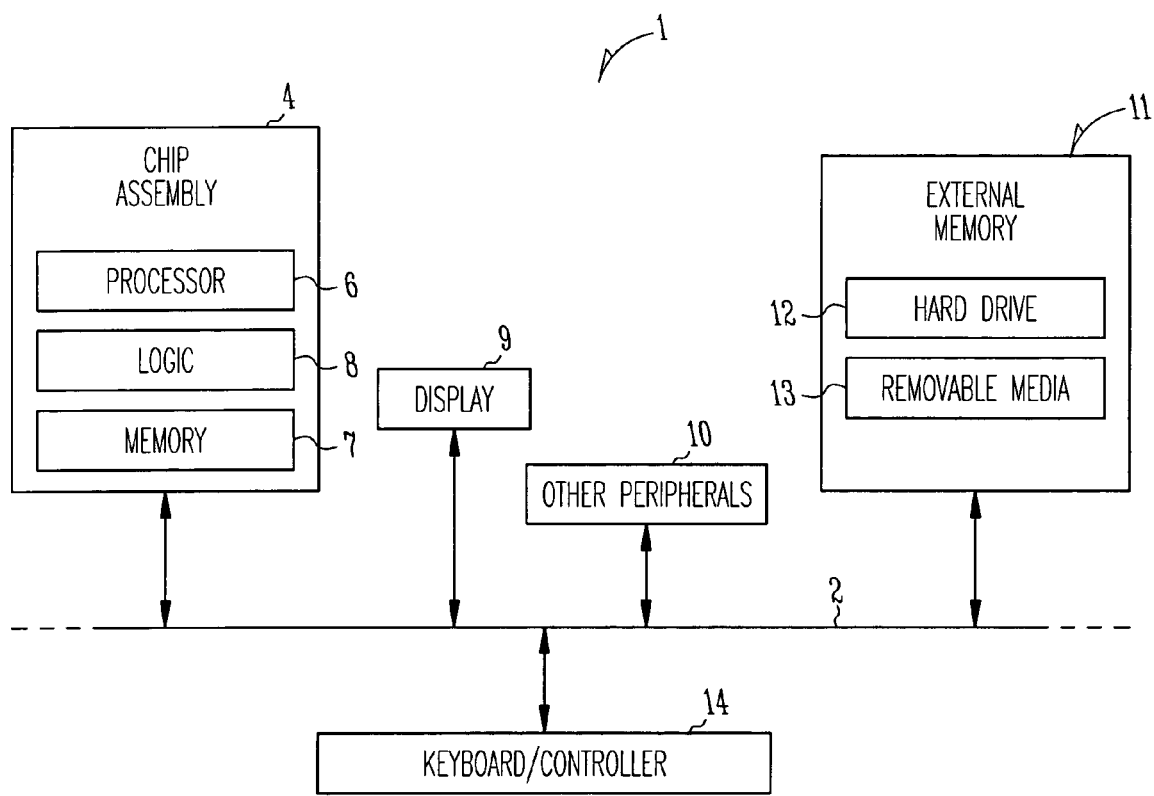
FIG. 1 illustrates an information handling system according to an embodiment of the invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Although the terms "memory chip" and "logic chip" are used in the following description, one of ordinary skill in the art will recognize that in one embodiment, a chip may include both memory circuitry and logic circuitry on the same chip. A chip with both memory circuitry and logic circuitry on the same chip is defined to be both a "memory chip" and a "logic chip" as used in the following description. The following detailed description is, therefore, not to be taken in a limiting sense, and the scope of the present invention is defined only by the appended claims, along with the full scope of equivalents to which such claims are entitled.

An example of an information handling system such as a personal computer is included to show an example of a high level device application for the present invention. FIG. 1 is a block diagram of an information handling system 1 incorporating at least one multi-chip assembly 4 in accordance with one embodiment of the invention. Information handling system 1 is merely one example of an electronic system in which the present invention can be used. Other examples, include, but are not limited to personal data assistants (PDA's), cellular telephones, aircraft, satellites, military vehicles, etc.

In this example, information handling system 1 comprises a data processing system that includes a system bus 2 to couple the various components of the system. System bus 2 provides communications links among the various components of the information handling system 1 and can be implemented as a single bus, as a combination of busses, or in any other suitable manner.

Multi-chip assembly 4 is coupled to the system bus 2. Multi-chip assembly 4 can include any circuit or combination of circuits. In one embodiment, multi-chip assembly 4 includes a processor 6 which can be of any type. As used herein, "processor" means any type of computational circuit, such as but not limited to a microprocessor, a microcontroller, a graphics processor, a digital signal processor (DSP), or any other type of processor or processing circuit.

In one embodiment, a memory chip 7 is included in the multi-chip assembly 4. Those skilled in the art will recognize that a wide variety of memory chips may be used in the multi-chip assembly 4. Acceptable types of memory chips include, but are not limited to Dynamic Random Access Memory (DRAMs) such as, SDRAMs, SLDRAMs, RDRAMs and other DRAMs. Static Random Access Memory (SRAMs), including VRAMs and EEPROMs, may also be used in the implementation of the present invention.

In one embodiment, additional logic chips 8 other than processor chips are included in the multi-chip assembly 4. An example of a logic chip 8 other than a processor includes an analog to digital converter. Other circuits on logic chips 8 such as custom circuits, an application-specific integrated circuit (ASIC), etc. are also included in one embodiment of the invention.

Information handling system 1 can also include an external memory 11, which in turn can include one or more memory elements suitable to the particular application, such as one or more hard drives 12, and/or one or more drives that handle removable media 13 such as floppy diskettes, compact disks (CDs), digital video disks (DVDs), and the like.

Information handling system 1 can also include a display device 9 such as a monitor, additional peripheral components 10, such as speakers, etc. and a keyboard and/or controller 14, which can include a mouse, trackball, game controller, voice-recognition device, or any other device that permits a system user to input information into and receive information from the information handling system 1.

Figure 2A:
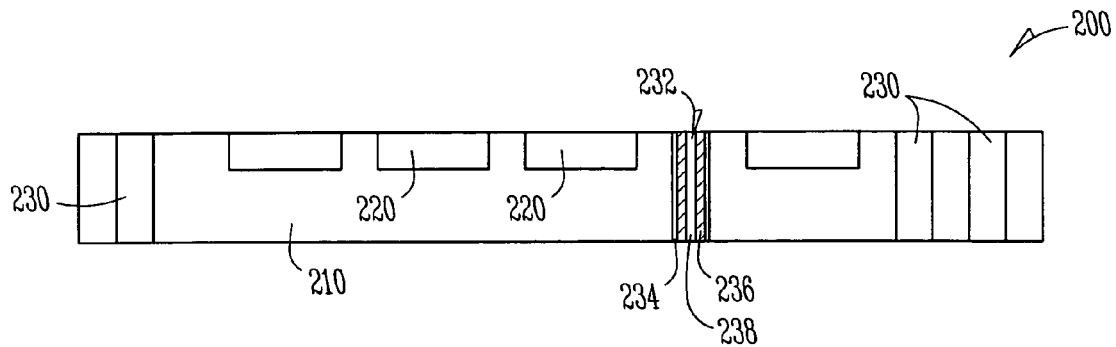
FIG. 2A illustrates a chip in a stage of manufacture according to an embodiment of the invention.

FIG. 2A shows a chip 200 in a stage of processing. The chip 200 includes a semiconductor substrate 210. In one embodiment, the semiconductor substrate 210 includes silicon. Other suitable semiconductor substrates 210 include alternate semiconducting materials such as gallium arsenide, or composite substrate structures such as silicon-on-insulator structures.

A number of devices 220 are shown in schematic form, located on or within the substrate 210. One common device 220 includes a transistor, however the invention is not so limited. In one embodiment, devices 220 further include devices such as diodes, capacitors, etc. A number of through chip connection structures 230 is also shown. In one embodiment, the through chip connection structures 230 are formed using a preferential etching process such as anodic etching to create a through chip channel with a high aspect ratio. In one embodiment, the channels are insulated by oxidation and later filled with a conductor such as a metal fill material to conduct signals through the chip 200. In one embodiment, the metal fill material includes aluminum metal.

In one example of anodic etching, a bottom surface of the substrate 210 is coupled to voltage source by a positive electrode. Further, a negative electrode is coupled to a voltage source and is placed in a bath of 6% aqueous solution of hydrofluoric acid (HF) on a surface of the substrate 210.

In operation, the anodic etch etches high aspect ratio holes through substrate 210 at the location of etch pits. The voltage source is turned on and provides a voltage across positive and negative electrodes. Etching current flows from the surface to the positive electrode. This current forms the high aspect ratio holes through the substrate 210. An anodic etching process is described in V. Lehmann, *The Physics of Macropore Formation in Low Doped n-Type Silicon*, J. Electrochem. Soc., Vol. 140, No. 10, pp. 2836-2843, October 1993, which is incorporated herein by reference.

In one embodiment, at least one through chip connection structure 230 includes a coaxial conductor 232. In one embodiment, using methods such as anodic etching, the connection structures 230 and/or coaxial conductors 232 have an aspect ratio in the range of approximately 100 to 200. Conventionally, a semiconductor wafer used to form an integrated circuit has a thickness in the range of approximately 500 to 1000 microns. Thus, the through chip connection structures 230 and coaxial conductors 232 can be fabricated with a width that is in the range from approximately 2.5 microns up to as much as approximately 10 microns. Even smaller through chip connections can be made in chips which are to be produced from wafers which are to be thinned after completion of the semiconductor processing. In this case, the small holes are processed, including the appropriate filling, to a depth which equals the thickness of the wafer after thinning. The wafers are thinned and connections are then made to the exposed through connections.

Coaxial conductors 232 include a center conductor 238 that is surrounded by insulator, e.g., oxide, 236. Further, outer conductor 234 surrounds insulator 236. Coaxial conductor 232 is shown in cross section in FIG. 2A. Outer conductor 234 comprises, for example, a metal layer that is deposited within a high aspect ratio via. Alternatively, outer conductor 234 may comprise a portion of the substrate 210 that has been doped with impurities to render it conductive.

In one embodiment, at least one through chip connection structure 230 includes an optical waveguide. One embodiment of an optical waveguide includes a reflective layer that is formed on inner surface of high aspect ratio holes. In one embodiment, the reflective layer includes a metallic mirror that is deposited with a self-limiting deposition process. This produces a reflective surface for an optical waveguide that is substantially uniform. In one embodiment, the optical waveguide has a center void that is essentially filled with air.

A two-step, selective process is used in one embodiment to deposit tungsten as a portion of the reflective layer. This is a low-pressure chemical vapor deposition (LPCVD) process. In this process, atoms in the substrate 210, e.g., silicon, are replaced by tungsten atoms in a reaction gas of $WF_6$. This is referred to as a "silicon reduction process." The limiting thickness of this process is approximately 5 to 10 nanometers. This thickness may not be sufficient for a reflective layer. Thus, a second reduction process can be used to complete the deposition of tungsten. This second reduction step uses silane or polysilane and is thus referred to as a "silane reduction." The silane reduction process also uses $WF_6$. In one embodiment, when tungsten is used for the reflective layer, a thin film of a material with a higher reflectivity is deposited on the tungsten material. For example, an aluminum film can be deposited at low temperature, e.g., in the range from 180° to 250° Celsius.

In one embodiment, several varieties of through chip connection structures 230, such as examples decribed above, are used on a single chip, or within a multi-chip assembly. In one embodiment, one type of through chip connection structure 230 is selected and used throughout each single chip 200, or a multi-chip assembly.

Figure 2B:
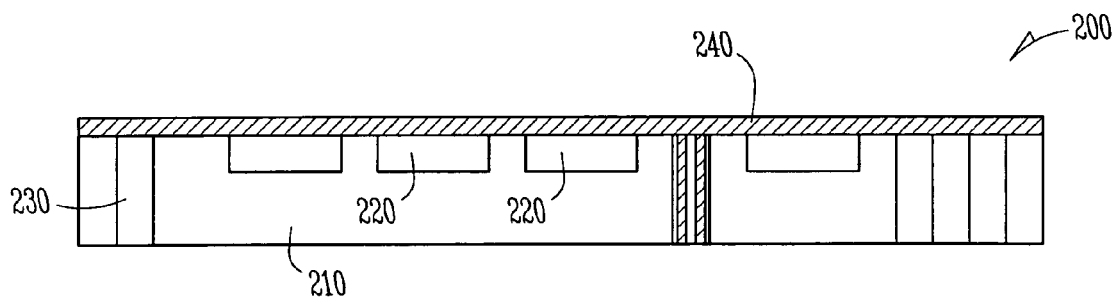
FIG. 2B illustrates a chip in a stage of manufacture according to an embodiment of the invention.

FIG. 2B shows a first insulator layer 240 attached to the chip 200 to isolate the number of devices 220 on a surface of the chip 200. Suitable insulator layers 240 include, but are not limited to oxides, or polymers such as polyimide.

Figure 2C:
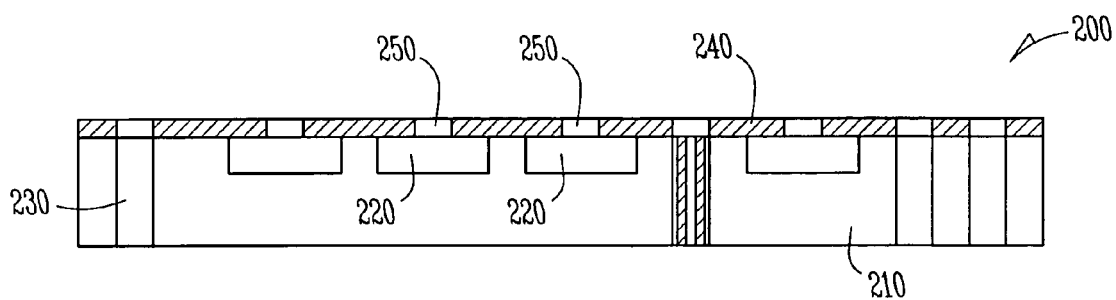
FIG. 2C illustrates a chip in a stage of manufacture according to an embodiment of the invention.

In FIG. 2C, a number of vias or contacts 250 are formed through the first insulator layer 240 to communicate with the number of devices 220 and the through chip connection structures 230. In one embodiment, a photolithographic process is used to pattern and remove selected portions of the first insulator layer 240 to form the vias or contacts 250.

Figure 2D:
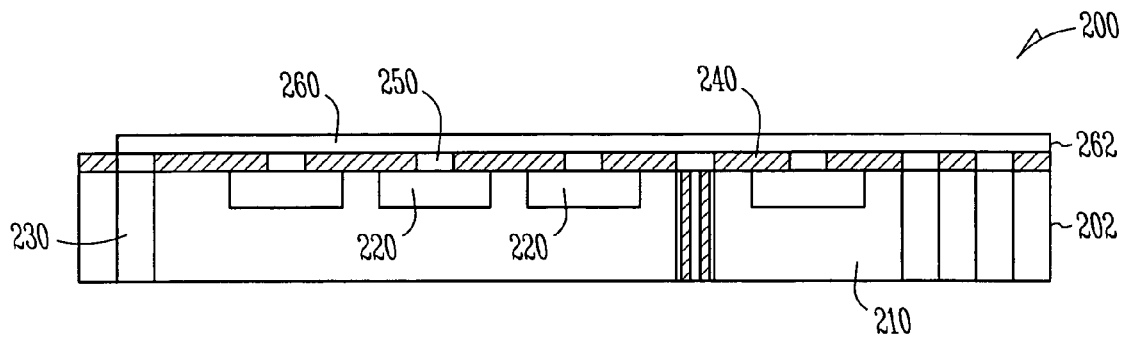
FIG. 2D illustrates a chip in a stage of manufacture according to an embodiment of the invention.

FIG. 2D shows a lateral connection structure 260. The lateral connection structure 260 is utilized for interconnecting selected devices 220 and/or connecting selected through chip connection structures 230. In one embodiment, the lateral connection structure 260 includes a metalized layer such as a metal trace line. In larger scale embodiments, a large network of lateral connection structures 260 such as metalized lines are used to connect devices on the chip 200 and form integrated circuits. In one embodiment, at least one end 262 of a lateral connection structure 260 is located adjacent to an edge 202 of the chip 200.

Figure 2E:
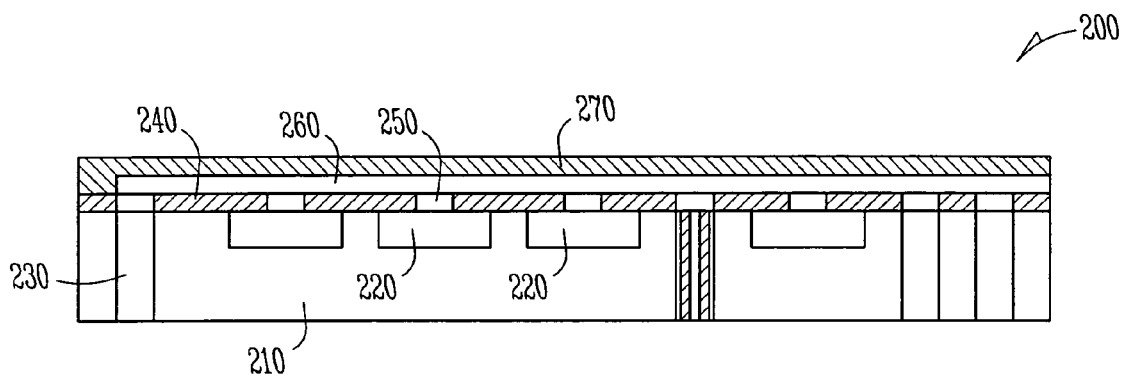
FIG. 2E illustrates a chip in a stage of manufacture according to an embodiment of the invention.

FIG. 2E shows a second insulator layer 270 attached to the chip 200 to isolate the lateral connection structure or structures 260. In one embodiment, the second insulator layer 270 includes a polymer layer. In one embodiment, a suitable polymer includes a polyimide. Some polyimides are able to withstand exposure to temperatures in a range from approximately 250-620° C. Endurance of the second insulator layer 270 at high temperatures is important because in some processes, the chip 200 is exposed to high processing temperatures before final manufacturing is complete. Suitable polyimides that posess a variety of physical properties include, but are not limited to, Type I, Type III, and Type V polyimides.

Other suitable polymeric materials include, for example, parylene, polynorbornenes and fluorinated polymers. Parylene-N has a melting point of 420° C., a tensile modulus of 2.4 GPa, and a yield strength of 42 MPa. One class of polynorbornene includes Avatrel™ polymer available from BF Goodrich, Cleveland, Ohio, USA. In one embodiment, silane is added to polynorbornenes to further lower the dielectric constant.

In addition to polymeric matrix materials, aerogels, such as silica aerogel, may be utilized to provide porous insulating material of the various embodiments. Aerogels are generally a gel material that forms a porous matrix when liquid or solvent in the gel is replaced by air or another gaseous component. Aerogels generally experience only minimal volumetric change upon such curing.

For embodiments that include a polymeric second insulator layer 270, the polymeric material is generally cured, or crosslinked, following formation. For one embodiment, curing can include an optional low temperature bake to drive off most of the solvents that may be present in the polymer prior to crosslinking. Other conventional polymers can be cured by exposing them to visible or ultraviolet light. Still other conventional polymers can be cured by adding curing (e.g., crosslinking) agents to the polymer.

Figure 2F:
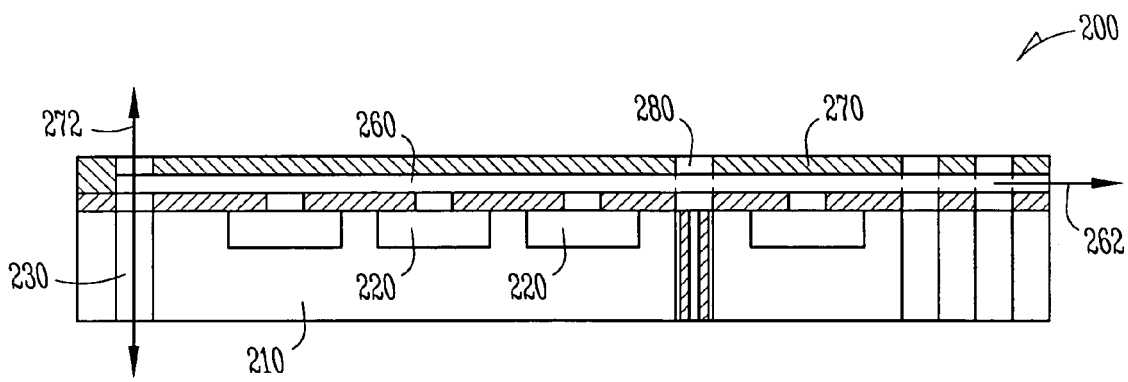
FIG. 2F illustrates a chip in a stage of manufacture according to an embodiment of the invention.

FIG. 2F shows a number of connection structures 280 formed through the second insulator layer 270 to complete a signal pathway for the through chip connection structures 230. As shown in FIG. 2F, the chip 200 now contains at least two types of connection structures. One type includes the through chip connection structures 230, which are designed to transmit signals substantially along direction 272. Another type includes the lateral connection structures 260, which are designed to transmit signals substantially along direction 262.

In one embodiment, selected through chip connection structures 230 are isolated from lateral connection structures 260, and only transmit signals through the chip 200. In one embodiment, selected through chip connection structures 230 are coupled to selected lateral connection structures 260 to communicate signals both through the chip 200 and laterally across the chip 200. One of ordinary skill in the art, having the benefit of the present disclosure will appreciate that a number of interconnection designs and combinations incorporating both through chip connection structures 230 and lateral connection structures 260 are possible depending on a given integrated circuit design and multi-chip assembly design.

Figure 2G:
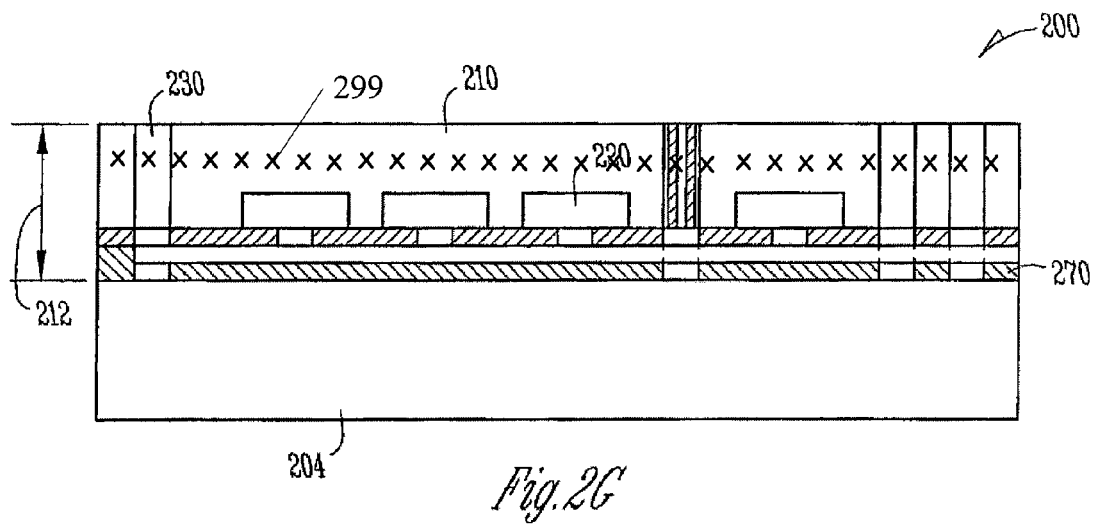
FIG. 2G illustrates a chip and carrier in a stage of manufacture according to an embodiment of the invention.

FIG. 2G shows the chip 200 mounted to a carrier 204. In one embodiment, the carrier 204 is used to facilitate thinning of the chip 200. A beginning thickness 212 of the chip 200 is indicated. In one embodiment, the carrier includes a sacrificial silicon wafer. Various methods are possible for attaching the chip 200 to the surface of the carrier 204. In one embodiment, the chip 200 is attached to the carrier using a water soluble epoxy, which facilitates removal of the chip 200 at a later stage of manufacturing. The chip 200 is shown mounted with a backside facing upwards and exposed for a thinning operation.

Figure 2H:
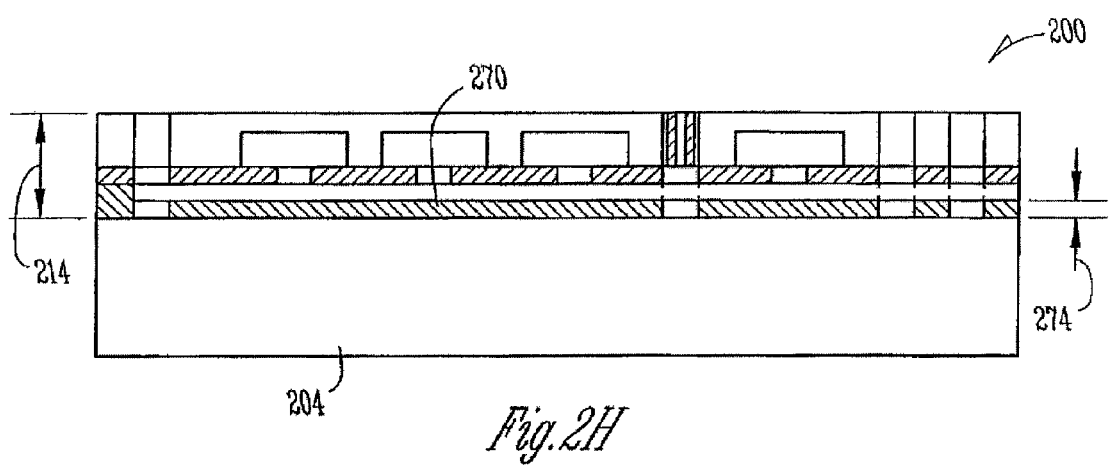
FIG. 2H illustrates a chip and carrier in a stage of manufacture according to an embodiment of the invention.

FIG. 2H shows the chip 200 after a thinning process. The chip 200 has been thinned to a thickness as indicated by 214. Any of a number of acceptable thinning processes can be used. In one embodiment, the chip 200 is thinned using chemical mechanical polishing (CMP) techniques. In one embodiment, a deep implant of p+ carriers 299 is implanted sufficient to a depth within the substrate 210 that is deeper than a maximum depth of the number of devices 220. In one embodiment, the through chip connection structures 230 are formed to a depth that is deeper than the depth of the p+ deep implant. The thinning process can then be set to stop at the depth from the backside of the chip 200 where the p+ layer is contacted. Using variations of this embodiment, the through chip connection structures 230 are exposed during the thinning process. Other embodiments are included that do not use the p+ deep implant and chip thinning technique.

Figure 2I:
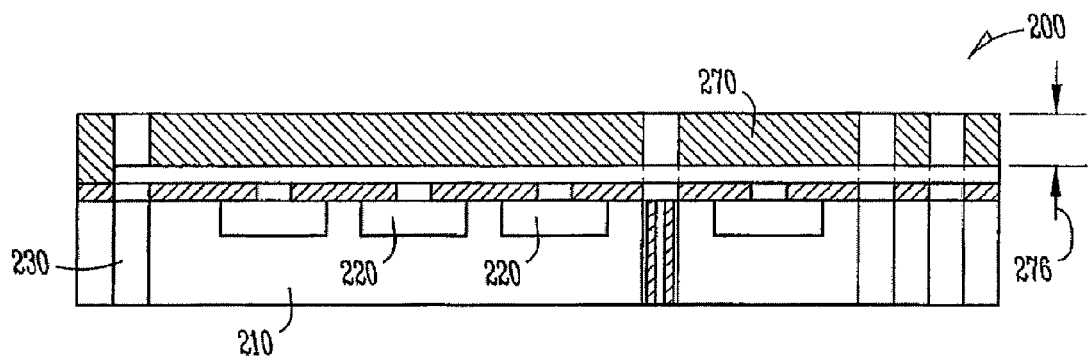
FIG. 2I illustrates a chip in a stage of manufacture according to an embodiment of the invention.

In one embodiment, the second insulator layer 270 includes cells of gaseous components. In one embodiment, an average cell size is less than 0.1 microns. In one embodiment, as shown in FIG. 2I, a polymer second insulator layer 270 is foamed to form cells of gaseous components. FIG. 2H shows the second insulator layer 270 with a thickness 274. In one embodiment, the thickness 274 is approximately 0.7 microns thick. FIG. 2I shows a second thickness 276 of the second insulator layer 270 after a foaming process. The chip 200 in FIG. 2I is shown without a carrier 204. In one embodiment, the second thickness 276 is approximately 2.1 microns thick.

In one embodiment, the foaming process is performed after the chip is thinned, as described above, although the invention is not so limited. The cells function to further reduce the dielectric constant. An increase in thickness of the second insulator layer 270 also reduces unwanted capacitive effects. Depending on the process used to foam the polymer in the second insulator layer 270, the cells may include air, or other gasses such as carbon dioxide.

In one embodiment, a supercritical fluid is utilized to convert at least a portion of the polymeric material, into a foamed polymeric material. Such use of supercritical fluids facilitates formation of sub-micron cells in the foamed polymeric material. A gas is determined to be in a supercritical state (and is referred to as a supercritical fluid) when it is subjected to a combination of pressure and temperature above its critical point, such that its density approaches that of a liquid (i.e., the liquid and gas states are indistinguishable). A wide variety of compounds and elements can be converted to the supercritical state in order to be used to form the second insulator layer 270.

Suitable supercritical fluids include, but are not limited to: ammonia ($NH_3$), an amine ($NR_3$), an alcohol (ROH), water ($H_2O$), carbon dioxide ($CO_2$), nitrous oxide ($N_2O$), a noble gas (e.g., He, Ne, Ar), a hydrogen halide (e.g., hydrofluoric acid (HF), hydrochloric acid (HCl), hydrobromic acid (HBr)), boron trichloride ($BCl_3$), chlorine ($Cl_2$), fluorine ($F_2$), oxygen ($O_2$) nitrogen ($N_2$), a hydrocarbon (e.g., dimethyl carbonate ($CO(OCH_3)_2$), methane ($CH_4$), ethane ($C_2H_6$), propane ($C_3H_8$), ethylene ($C_2H_4$), etc.), a fluorocarbon (e.g., $CF_4$, $C_2F_4$, $CH_3F$, etc.), hexafluoroacetylacetone ($C_5H_2F_6O_2$), and combinations thereof.

Although these and other fluids may be used, it is preferable to have a fluid with a low critical pressure, preferably below about 100 atmospheres, and a low critical temperature of at or near room temperature. Further, it is preferred that the fluids be nontoxic and nonflammable. Likewise, the fluids should not degrade the properties of the polymeric material. For one embodiment, supercritical fluid $CO_2$ is utilized, due to the relatively inert nature of $CO_2$ with respect to most polymeric materials as well as other materials utilized in integrated circuit fabrication.

A selected polymer in one embodiment of a second insulator layer 270 is exposed to the supercritical fluid for a sufficient time period to foam at least a portion of the polymeric material. In one embodiment, the chip 200 is placed in a processing chamber, and the temperature and pressure of the processing chamber are elevated above the temperature and pressure needed for creating and maintaining the particular supercritical fluid. After the second insulator layer 270 is exposed to the supercritical fluid for a sufficient period of time to saturate the polymeric material with supercritical fluid, the flow of supercritical fluid is stopped and the processing chamber is depressurized. Upon depressurization, the foaming of the polymeric material occurs as the supercritical state of the fluid is no longer maintained, and cells are formed in the polymeric material.

One of ordinary skill in the art, having the benefit of the present disclosure will recognize that other foaming techniques may be used in place of or in combination with that described herein in accordance with the present invention. For example, foams may also be formed by use of block co-polymers.

In one embodiment, polymer materials such as embodiments of the second insulator layer 270, include hydrophilic polymers. The use of a hydrophilic polymer is advantageous because moisture is attracted away from metal or semiconductor devices in the chip 200 where water could cause corrosion damage. In one embodiment, in contrast to choosing a hydrophilic polymer, a hydrophilic treatment is added to whatever polymer or insulator layer is selected. In one embodiment, the hydrophilic treatment includes introduction of methane radicals to a surface of the insulator layer. In one embodiment, the methane radicals are created using a high frequency electric field. By utilizing an additional treatment process, the insulator layer can be selected based on other material properties such as dielectric constant, and the additional desirable property of a hydrophilic nature can be added to the chosen material.

Figure 2J:
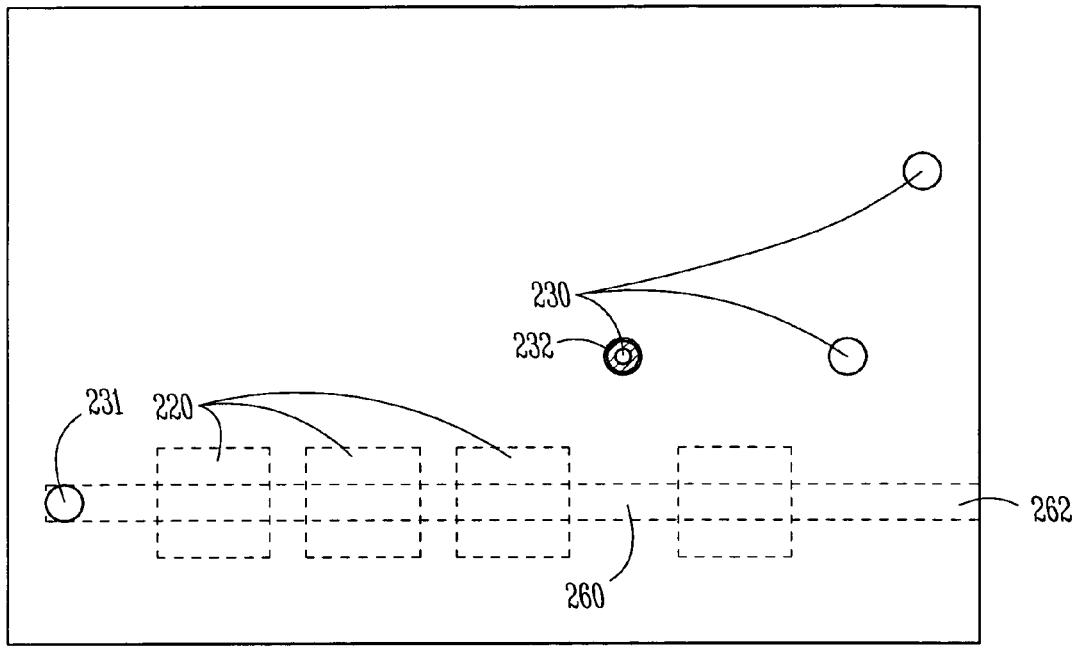
FIG. 2J illustrates a top view of a chip in a stage of manufacture according to an embodiment of the invention.

FIG. 2J shows the chip 200 from another angle to further illustrate possible locations of structures in the chip 200 as described above. The number of devices 220 are shown, with the lateral connection structure 260 coupling to the illustrated devices 220. The lateral connection structure 260 includes an end 262 that is adjacent to a chip edge as described above. The number of through chip connection structures 230 are shown in various locations on the chip 200. As described above, selected through chip connection structures 230 such as individual structure 231 are coupled to other circuitry such as the lateral connection structure 260. As an example a selected through chip connection structure 230 is shown as a coaxial structure 232. As described above, coaxial structures 232 are one possible embodiment of through chip connection structures 230.

In one embodiment, selected chip connection structures, including through chip connection structures 230 and lateral connection structure 260 are coupled to terminal metals to facilitate later connection to other chips. In one embodiment, terminal metals include ZrNiCuAu pads and solder applied to aluminum contact metal.

Figure 3:
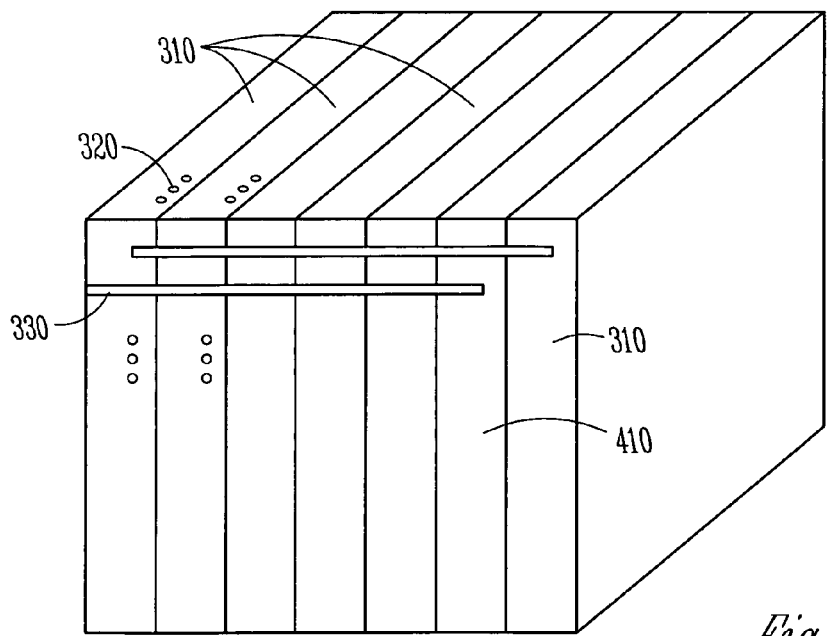
FIG. 3 illustrates a multi-chip assembly according to an embodiment of the invention.

FIG. 3 illustrates one example of a multi-chip assembly 300 using embodiments of chips as described in embodiments above. A number of chips 310 are shown coupled together to form an assembly. In FIG. 3, the assembly 300 includes a cube like assembly, although the invention is not so limited. Other geometries of multi-chip assemblies are possible, such as rectangular assemblies, or other complex geometries that utilize through chip connection structures and lateral connection structures are within the scope of the invention.

A number of chip edge connections 320 are illustrated. In one embodiment, the chip edge connections 320 are formed by removing material from the edges of chips 310 to expose lateral connection structures as described in embodiments above. In one embodiment, removing material includes etching back the edges of the chips 310. A number of chip edge interconnects 330 are also shown coupling selected chip edge connections 320. In one embodiment, the chip edge interconnects 330 include metal trace lines.

In one embodiment, the number of chips 310 include both memory chips such as DRAM, SRAM, or flash chips. In one embodiment, the number of chips 310 also includes at least one logic chip. As discussed above, logic chips include processor chips, or other specialized logic chips such as analog to digital converter chips. In one embodiment, a processor chip is included as a logic chip, and is located on an external surface of the multi-chip assembly 300. Location on an external surface is advantageous because cooling is enhanced on external surfaces of the multi-chip assembly 300. Logic chips such as processor chips tend to generate large amounts of heat compared to memory chips, therefore location of logic chips on external surfaces is desired. In some embodiments, multiple logic or processor chips are included, and external surfaces may not be available for all logic chips. In embodiments such as these, logic chips may be located internal to the multi-chip assembly 300.

Although not visible in FIG. 3, the multi-chip assembly 300 includes chips with both lateral connection structures and through chip connection structures as described in embodiments above. The use of both lateral connection structures and through chip connection structures is advantageous because more pathways are available for the chips 310 in the multi-chip assembly 300 to communicate with each other. If only edge connections were used, the number of connections would be limited to the space on the edge of the chips. Using embodiments described above, a multi-chip assembly 300 is able to also utilize through chip connection structures to increase the number of connections between chips.

Further, the distance of a connection between selected regions from one chip to another is significantly reduced using embodiments described above. In many instances, a connection pathway directly through the middle of a chip using a through chip connection is significantly shorter than connecting out to an edge of one chip, then back into another chip from that chip edge. Shorter connection pathways lead to increased speed and performance of multi-chip assemblies 300.

Figure 4:
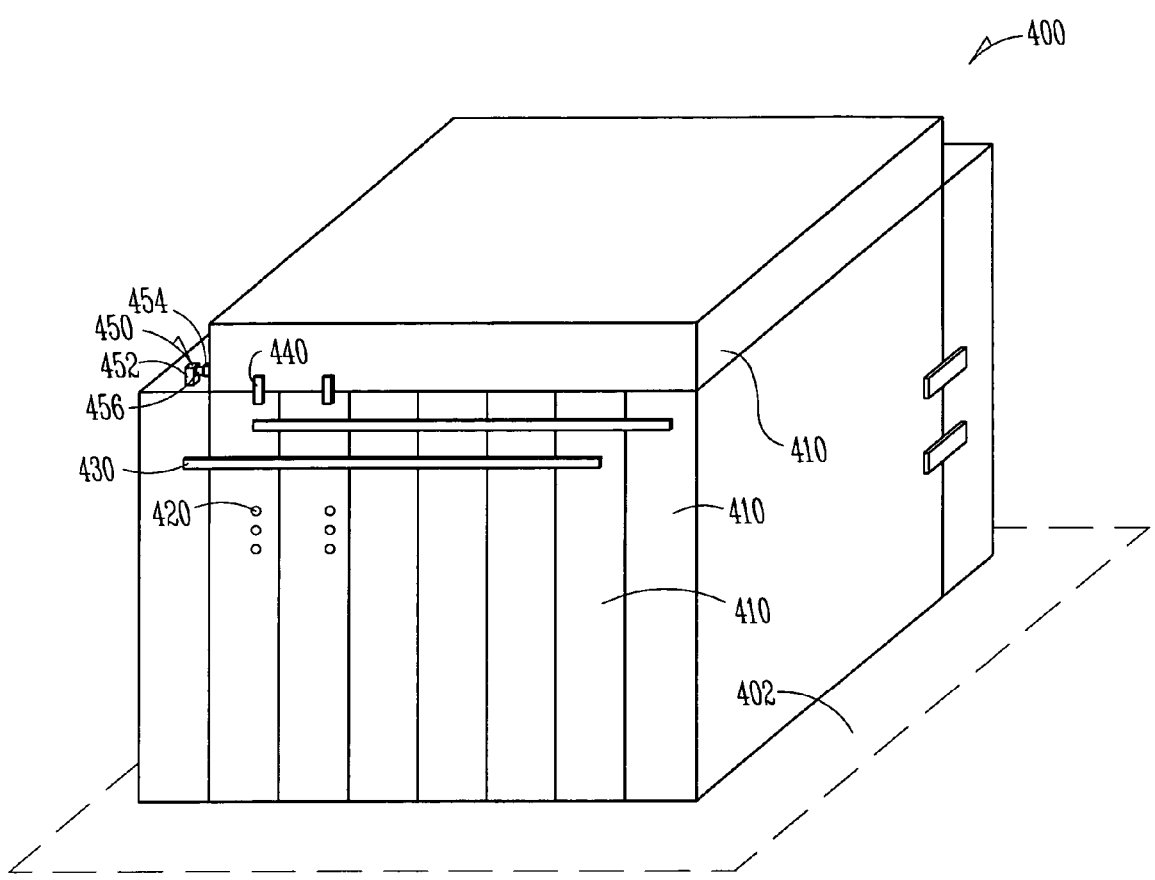
FIG. 4 illustrates another multi-chip assembly according to an embodiment of the invention.

FIG. 4 shows an embodiment of a multi-chip assembly 400. A number of chips 410 are shown coupled together to form the assembly 400. In the Figure, the multi-chip assembly 400 is shown attached to a surface 402 such as a motherboard. A number of chip edge connections 420 are illustrated. In one embodiment, the chip edge connections 420 are formed by removing material from the edges of chips 410 to expose lateral connection structures as described in embodiments above. In one embodiment, removing material includes etching back the edges of the chips 410. A number of chip edge interconnects 430 are also shown coupling selected chip edge connections 420. In one embodiment, the chip edge interconnects 430 include metal trace lines.

Similar to embodiments discussed above, in one embodiment at least one logic chip, such as a processor, is included in the number of chips 410. In FIG. 4, a logic chip is shown coupled to the top of the multi-chip assembly 400. A second number of chip edge interconnects 440 is shown coupling to this logic chip. The second number of chip edge interconnects 440 illustrate one possible connection method to connect chips that are orthogonal to each other. Although the figure illustrates orthogonal chips, other angles apart from 90 degrees are possible between chips of the multi-chip assembly 400.

Also illustrated in FIG. 4 is a corner connection structure 450. In one embodiment, the corner connection structure includes a first conducting pillar 452, a second conducting pillar 454 and a solder ball 456. Other embodiments of corner connection structures are also included within the scope of the invention. Acceptable devices and methods are described in commonly assigned U.S. Pat. No. 6,552,424 which is incorporated herein by reference in its entirety.

CONCLUSION

Using devices and methods as described above, a multi-chip assembly is provided that uses both lateral connection structures and through chip connection structures. One advantage of this design includes an increased number of possible connections. Another advantage of this design includes shorter distances for interconnection pathways, which improves device performance and speed. Numerous other advantages are provided by embodiments described above, including but not limited to: decreased capacitive coupling from improved isolation structures and materials; decreased corrosion probability due to hydrophilic materials; improved cooling due to locations of logic chips; reduced assembly size due to thinning of chips; etc.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a multi-chip assembly, comprising:
   forming a number of electronic devices in a substrate of one or more chips in a number of chips;

implanting a p+ carrier in the substrate to a depth that is deeper than the number of electronic devices;

forming a number of chip edge connection structures in selected chips of the number of chips;

forming a number of through chip connection structures in selected chips of the number of chips;

mounting at least one chip upside down in the multi-chip assembly to expose a back side;

reducing a thickness of at least one chip in the number of chips without disturbing the electronic devices by removing material from the back side until the p+ carrier is detected; and interconnecting portions of the number of chips using the chip edge connection structures and the through chip connection structures, wherein at least one logic chip and at least one memory chip are included in the number of chips.

2. The method of claim 1, wherein forming the number of chip edge connection structures and forming the number of through chip connection structures includes forming at least one chip edge connection structure and at least one through chip connection structure on each chip in the number of chips.

3. The method of claim 1, wherein forming the number of through chip connection structures includes forming a number of coaxial conductor structures.

4. The method of claim 1, wherein forming the number of through chip connection structures includes forming a number of optical waveguide structures.

5. The method of claim 1, further including forming an insulator layer between two adjacent chips in the number of chips.

6. The method of claim 5, wherein forming the insulator layer includes forming a polymer insulator layer that includes a number of cells of gaseous components.

7. The method of claim 1, wherein interconnecting portions of the number of chips includes forming the number of chips in a cube structure.

8. The method of claim 7, wherein interconnecting portions of the number of chips in the cube structure includes interconnecting a number of memory chips with at least one logic chip on an outside face of the cube structure.

9. A method of forming a multi-chip assembly, comprising:
forming a number of electronic devices in a substrate of one or more chips in a number of chips;
implanting a p+ region in the substrate to a depth that is deeper than the number of electronic devices;
forming a number of chip edge connection structures in selected chips of a number of chips;
forming a number of through chip connection structures in selected chips of the number of chips;
mounting at least one chip upside down on a carrier wafer to expose a back side;
reducing a thickness of at least one chip in the number of chips without disturbing the electronic devices by removing material from the back side until the p+ region is detected; and
interconnecting portions of the number of chips using the chip edge connection structures and the through chip connection structures, wherein at least one logic chip and at least one memory chip are included in the number of chips.

10. The method of claim 9, further including forming an insulator layer between two adjacent chips in the number of chips.

11. The method of claim 10, further including forming a hydrophilic layer coupled to an exterior surface of the insulator layer.

12. The method of claim 10, wherein forming the insulator layer includes forming a polymer insulator layer that includes a number of cells of gaseous components.

13. The method of claim 12, wherein forming the polymer insulator layer that includes the number of cells of gaseous components includes utilizing a supercritical fluid to form the number of cells of gaseous components.

14. The method of claim 9, wherein interconnecting portions of the number of chips includes forming the number of chips in a cube structure.

15. The method of claim 14, wherein interconnecting portions of the number of chips in the cube structure includes interconnecting a number of memory chips with at least one logic chip on an outside face of the cube structure.

16. A method of forming a multi-chip assembly, comprising:
forming a number of electronic devices in a substrate of one or more chips in a number of chips;
implanting a p+ carrier in the substrate to a depth that is deeper than the number of electronic devices;
forming a number of chip edge connection structures in selected chips of a number of chips;
forming a number of through chip connection structures in selected chips of the number of chips;
mounting at least one chip upside down to expose a back side;
reducing a thickness of at least one chip in the number of chips without disturbing the electronic devices by removing material from the back side until the p+ carrier is detected;
forming an insulator layer that provides a direct interface between at least two interconnected faces of chips in the number of chips and surrounding a portion of at least one through chip connection structure, the insulating layer including cells of a gaseous component; and
interconnecting portions of the number of chips using the chip edge connection structures and the through chip connection structures, wherein at least one logic chip and at least one memory chip are included in the number of chips.

17. The method of claim 16, further including forming a hydrophilic layer coupled to an exterior surface of the insulator layer.

18. The method of claim 17, wherein forming the hydrophilic layer coupled to the exterior surface of the insulator layer includes coupling methane radicals to an exterior surface of the insulator layer.

19. The method of claim 16, wherein forming the insulator layer between two adjacent chips includes utilizing a supercritical fluid to form the cells of the gaseous component.

20. The method of claim 19, wherein utilizing the supercritical fluid to form the cells of the gaseous component includes utilizing supercritical carbon dioxide to form the cells of the gaseous component.

* * * * *